(12) United States Patent
Baecker et al.

(10) Patent No.: US 11,390,478 B2
(45) Date of Patent: Jul. 19, 2022

(54) ROLL-TO-ROLL APPARATUS FOR PROCESSING METAL TAPES WITH A CERAMIC COATING

(71) Applicant: American Superconductor Corporation, Ayer, MA (US)

(72) Inventors: Michael Baecker, Rheinbach (DE); Thomas Braun, Rheinbach (DE); Ruslan Karabalaev, Rheinbach (DE)

(73) Assignee: American Superconductor Corporation, Ayer, MA (US)

( * ) Notice: Subject to any disclaimer, the term of this patent is extended or adjusted under 35 U.S.C. 154(b) by 288 days.

(21) Appl. No.: 16/615,348

(22) PCT Filed: May 30, 2018

(86) PCT No.: PCT/EP2018/064139
§ 371 (c)(1),
(2) Date: Nov. 20, 2019

(87) PCT Pub. No.: WO2018/224366
PCT Pub. Date: Dec. 13, 2018

(65) Prior Publication Data
US 2020/0198913 A1 Jun. 25, 2020

(30) Foreign Application Priority Data

Jun. 8, 2017 (EP) .................................... 17174875

(51) Int. Cl.
*B65H 18/10* (2006.01)
*B65H 23/16* (2006.01)
*H01L 39/24* (2006.01)

(52) U.S. Cl.
CPC .......... *B65H 18/103* (2013.01); *B65H 23/16* (2013.01); *H01L 39/24* (2013.01);
(Continued)

(58) Field of Classification Search
None
See application file for complete search history.

(56) References Cited

U.S. PATENT DOCUMENTS 4,283,024 A * 8/1981 Sienkiewicz .......... B65H 51/20
242/417.3
4,763,601 A 8/1988 Saida et al.
(Continued)

FOREIGN PATENT DOCUMENTS

DE 10 2015 119 259 A1 5/2017
EP 0 305 573 A1 3/1989
(Continued)

OTHER PUBLICATIONS

International Search Report dated Nov. 14, 2018 in PCT/EP2018/064139 filed on May 30, 2018.

*Primary Examiner* — William A. Rivera
(74) *Attorney, Agent, or Firm* — Sunstein LLP

(57) ABSTRACT

The present invention is in the field of A roll-to-roll apparatus for processing metal tapes with a ceramic coating. In particular, the present invention relates to a roll-to-roll apparatus for pro-cessing metal tapes with a ceramic coating comprising at least two rolls with fixed axis position, and at least one roll with variable axis position to adjust the tape position and/or tension, wherein the position and the diameter of the rolls are adjusted to touch the metal tape only from one side and to limit the stress on the metal tape at any point such that the metal tape is not stretched by more than 0.15%.

11 Claims, 3 Drawing Sheets

(52) U.S. Cl.
CPC ............... *B65H 2601/2532* (2013.01); *B65H 2701/11332* (2013.01); *B65H 2701/173* (2013.01)

(56) References Cited

U.S. PATENT DOCUMENTS

| | | | | |
|---|---|---|---|---|
| 6,024,319 | A | * | 2/2000 | Kawabata ............... B65H 59/36 |
| | | | | 226/118.3 |
| 6,536,700 | B2 | * | 3/2003 | Watson ................... B65H 59/36 |
| | | | | 242/154 |
| 2012/0018564 | A1 | * | 1/2012 | Schmitz ................ B21C 47/003 |
| | | | | 242/419.8 |
| 2012/0204791 | A1 | | 8/2012 | Gross et al. |
| 2014/0069568 | A1 | * | 3/2014 | Mohapatra ............. H05K 13/04 |
| | | | | 156/64 |
| 2017/0073264 | A1 | * | 3/2017 | Lotze ..................... B65H 23/16 |
| 2021/0115530 | A1 | * | 4/2021 | Masuoka .............. C22C 38/005 |
| 2021/0238001 | A1 | * | 8/2021 | Lee ................... H01L 31/02168 |

FOREIGN PATENT DOCUMENTS

| WO | WO 2009/094622 A2 | 7/2009 |
|---|---|---|
| WO | WO 2011/026997 A1 | 3/2011 |

* cited by examiner

ROLL-TO-ROLL APPARATUS FOR PROCESSING METAL TAPES WITH A CERAMIC COATING

FIELD OF INVENTION

The present invention is in the field of roll-to-roll apparatuses for processing metal tapes with a ceramic coating.

BACKGROUND ART

Metals with ceramic coatings have a widespread field of applications. The ceramic coating may serve to modify the metal, e.g. its corrosion resistance, its optical or electric properties. In addition, there are applications in which the metal serves as substrate for the ceramic, for example in the field of high-temperature superconductors, where the ceramic superconductor is deposited on a metal substrate. When produced on an industrial scale the metal with a ceramic coating is often in tape form and stored winded up on a spool. In order to process this tape an apparatus is required which unwinds the tape from the spool and manipulates it without damaging the ceramic layer.

WO 2009/094 622 A2 discloses a typical roll-to-roll apparatus for processing metal tapes. Such apparatuses work well for robust ceramic coatings which can be touched by the rolls of the apparatus and which withstand high tension. However, in case the ceramic coating is very thin and brittle as it is the case for many applications, the known apparatus cannot be used without causing unacceptable damage to the ceramic coating. Simply reducing the tension for the metal tape is not an option because in this case, the tape will only be held in position by the sides off the spools. In particular for wide tapes, the forces at the edges of the tape will then become too large leading to damages of the tape and the ceramic coating.

SUMMARY OF EMBODIMENTS

It was an object of the present invention to provide an apparatus which can be used to process metal tapes with mechanically sensitive ceramic coatings without damage. At the same time the apparatus was aimed to lead the metal tape in a very stable position to allow for precise processing steps such as deposition, etching, or structuring.

These objects were achieved by a roll-to-roll apparatus for processing metal tapes with a ceramic coating comprising at least two rolls with fixed axis position and at least one roll with variable axis position to adjust the tape position and/or tension, wherein the position and the diameter of the rolls are adjusted to touch the metal tape only from one side and to limit the stress on the metal tape at any point such that the metal tape is not stretched by more than 0.15%.

The present invention further relates to the use of the apparatus according to the present invention for processing of a metal tape.

BRIEF DESCRIPTION OF THE DRAWINGS

Embodiments of the present disclosure will now be described, by way of example only, with reference to the attached Figures, wherein.

DETAILED DESCRIPTION OF SPECIFIC EMBODIMENTS

Figure 1:
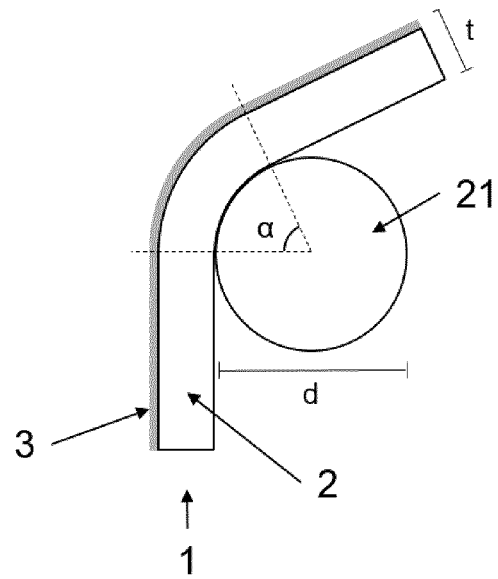
FIG. 1 shows a cross section of a deflection roll with a tape partially wrapped around it according to an embodiment on this disclosure.

Preferred embodiments of the present invention can be found in the description and the claims. Combinations of different embodiments fall within the scope of the present invention.

The roll-to-roll apparatus according to the present invention is adapted for mounting a supply spool and a receiving spool. The metal tape is unwound from the supply spool processed and then wound onto the receiving spool. Furthermore, the apparatus is typically capable of rotating the supply and/or the receiving spool to unwind and re-wind the metal tape with the ceramic coating. The speed of rotation of the supply and/or the receiving spool typically adjusts the speed by which the tape is moved in the apparatus. Typical values are 0.1 to 300 m/h, preferably 1 to 200 m/h, more preferably 5 to 100 m/h, in particular 10 to 50 m/h, for example 30 m/h.

The metal tape can contain any metal, for example stainless steel, aluminum, nickel, copper, zinc, or brass. It is also possible that the metal tape is a laminate of more than one metal, e.g. copper layer on a stainless steel layer. The metal tape can have various thicknesses, such as 10 µm to 1 mm, preferably 30 to 200 µm. The metal tape can have various widths, such as 1 mm to 2 m, preferably 1 cm to 1 m, more preferably 4 to 50, in particular 10 to 40 cm. The metal tape can have various lengths, such as 1 m to 10 km, preferably 100 m to 1 km.

The ceramic coating can contain various inorganic materials including oxides, nitrides, carbides, or borides. The ceramic coatings can contain metals and/or semimetals including Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Examples for ceramic coatings include magnesium oxide, cerium oxide, various zirconates, such as gadolinium zirconate, lanthanum zirconate, or yttrium-stabilized zirconium oxide (YSZ); titanates, such as strontium titanate; copper oxides such as yttrium-barium-copper oxide (YBCO). It is also possible that the ceramic coating contains more than one layer of a ceramic material. The thickness of the ceramic coating can be in a wide range, such as 0.5 nm to 1 mm, preferably 5 nm to 100 µm, in particular 10 nm to 10 µm.

The roll-to-roll apparatus according to the present invention comprises at least two rolls with fixed axis position which serve as deflector rolls and at least one roll with variable axis position to adjust the tape position and/or tension. The latter is referred to as adjustment roll in the following. Preferably, the adjustment roll is in a position between the at least two deflector rolls with regard to the moving direction of the metal tape. For complex processing or for very sensitive ceramic coatings it is advantageous if the roll-to-roll apparatus comprises more than two deflector rolls, for example at least three or at least four. It is possible that all deflector rolls have the same geometry or they are different to each other. It is also possible that the roll-to-roll apparatus comprises more than one adjustment roll, for example at least two or at least three. If the roll-to-roll apparatus comprises more than one adjustment roll, it is possible that all adjustment rolls have the same geometry or they are different to each other.

The term roll in the context of the present invention refers to an object having one axis which is invariant with regard to rotation, such as a cylinder. A roll in the apparatus according to the present invention can be mounted such that it can rotate or it can be fixed, so the roll acts like a slide over which the metal tape with the ceramic coating slips. Preferably, the roll can rotate. The term geometry refers to the shape as well as the dimension of the rolls. The shape can be cylindrical or they can have convex or a concave cross-section. The rolls can be made of different materials, for example steel, aluminum, copper, brass, or a polymer. It is also possible, that the surface of the roll is of a different material than its core, for example the core is of steel and the surface of a soft polymer.

The ceramic coating experiences tension as a result of the strain exerted on the tape as a whole as well as by bending around a roll. The tension leads to a relative expansion which is defined as the ratio of length increase by the length of the fully relaxed tape. The strain exerted on the tape as a whole is typically adjusted by the supply spool and the receiver spool, e.g. if the receiver spool pulls on the tape in one direction while the supply spool pulls in the opposite direction balancing the resulting force. The strain is typically in the order of 5 to 100 N/mm$^2$ and needs to be adjusted according to the elasticity of the metal tape in order to not exceed the maximum tape stretch. The relative expansion arising from the bending around a deflection roll $\mu_d$ depends on the diameter of the roll d and the thickness of the tape t which can be approximated by formula (I).

$$\mu_d = \frac{\pi(d+2t) - \pi(d+t)}{\pi(d+t)} = \frac{t}{d+t} \tag{I}$$

FIG. 1 shows a cross section of a deflection roll with a tape partially wrapped around it with the variables uses in the formula above. A tape (1) with the thickness t containing a metal tape (1) with a ceramic coating (3) is wrapped by the wrap angle α around a deflection roll (21) having the diameter d.

In order to reduce the strain caused by bending around a deflection roll, it is possible to increase the diameter of the deflection roll, preferably it is at least 5 cm, more preferably at least 10 cm, for example 20 to 50 cm.

Figure 2:
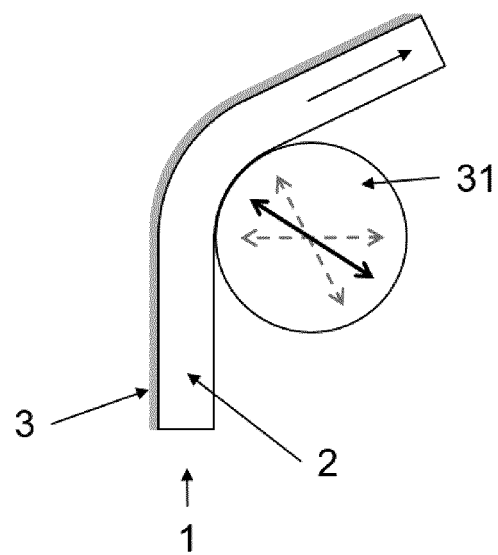
FIG. 2 shows two movement directions of the deflection roll indicated as grey broken arrows.

Preferably, the axis of the adjustment roll can be changed in two ways: the axis can be moved or tilted. After a movement, the axis is parallel to its position before the movement. Preferably the movement direction is parallel to the surface normal of the coated side of the tape just before the tape touches the adjustment roll with respect to the moving direction of the tape or parallel to the surface normal of the coated side of the tape just after the tape ceases to touch the adjustment roll with respect to the moving direction, or parallel to any line in between. Said two movement directions are indicated as grey broken arrows in FIG. 2. Preferably the movement direction is along a line which is the angle bisector of said two surface normal or is about the angle bisector of said two surface normals as indicated by the bold arrow in FIG. 2. Such a movement increases or decreases the tension of the whole tape depending on the direction of the movement. Alternatively or additionally, the axis can be tilted around the moving direction of the tape by the angle β. If the tape is wrapped around the adjustment roll, the axis can be tilted in a plane perpendicular to the moving direction at the point where the tape begins touching the adjustment roll or in a plane perpendicular to the moving direction at the point where the tape ends touching the adjustment roll or any plane in between, preferably the axis is tilted in a plane perpendicular to the moving direction, wherein the surface normal of the plane is or is about the angle bisect of the formerly mentioned two planes. The tilt causes the tape to be bent upward at the side leading to a force which moves the tape to the side opposite the bent side. In this way, the position of the tape can be adjusted.

The adjustment roll exerts a relative expansion $\mu_a$ which depends on the wrap angle α, the width of the tape which is bent upward a, the tilt angle β in degrees, the diameter of the roll d and the thickness of the tape t, and the distance between the adjustment roll and the distance to the closest deflection roll c with regard to the path which the tape follows. The relative expansion $\mu_a$ can be approximated by formula (II).

$$\mu_a = \frac{\frac{\alpha}{180°} \cdot a \cdot \sin \beta}{\frac{\alpha}{360°} \cdot \pi \cdot r + c} \tag{II}$$

Figure 3:
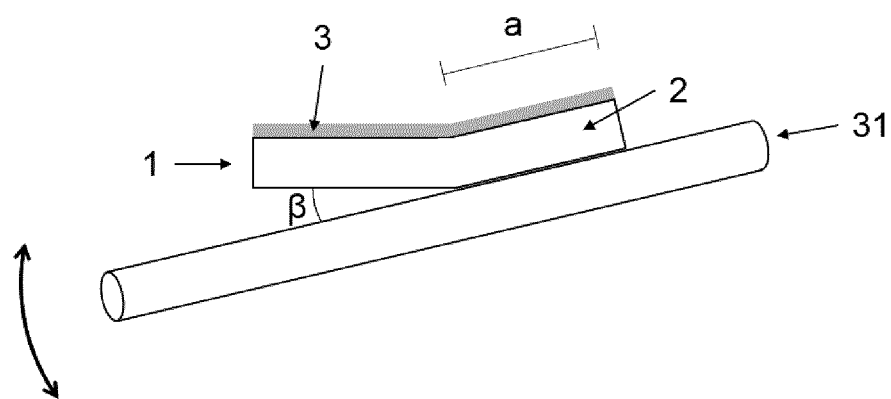
FIG. 3 shows an adjustment roll viewed in the direction of the movement of the tape with the metal tape and the ceramic coating.

FIG. 3 shows an adjustment roll (31) viewed in the direction of the movement of the tape (1) with the metal tape (2) and the ceramic coating (3). The adjustment roll is tilted by the angle β against the tape (1), thereby touching the tape (1) by the length a on the right side which causes the tape (1) to move to the left side. The tilting of the adjustment roll is indicated by the bold arrow.

In order to reduce the strain caused by bending around an adjustment roll, it is possible to reduce the wrap angle around the adjustment roll and/or increase the diameter of the adjustment roll. Preferably, the wrap angle around the adjustment roll is lower than the wrap angle around the deflection rolls, preferably less than 90°, more preferably less than 60°, in particular 10° to 45°. Alternatively or additionally, the diameter of the adjustment roll is large, preferably at least 5 cm, more preferably at least 10 cm, for example 20 to 50 cm.

Further, it is possible to reduce the tilt angle β and/or the width a. This is typically achieved by a very quick response to deviations from the set position of the tape by the adjustment roll. Preferably, the maximum tilt angle β is less than 10°, more preferably less than 7°, in particular less than 6°, for example 0.1° to 5°. Also, it is possible to increase the distance of the adjustment roll to the closest deflection roll c. The value c is the length of the tape between the point where it touches the adjustment roll and the point where it touches the deflection roll. The value c is preferably 0.5 to 50 times the width of the tape, more preferably 1.5 to 20 times the width of the tape, even more preferably 3 to 15 times the width of the tape, in particular 4 to 10 times the width of the tape.

According to the present invention, the position and the diameter of the rolls are adjusted to touch the metal tape only from one side and to limit the stress on the metal tape at any point such that the metal tape is not stretched by more than 0.15%, preferably not more than 0.12%, in particular not more than 0.1%. Often, the metal tape is stretched by at least 0.01%. As an example, for a nickel tape containing 5 at-% tungsten and having an elasticity module of 118 kN/mm$^2$, the maximum strain exerted on the tape by the apparatus is 177 N/mm$^2$. Therefore, the apparatus is preferably designed to exert a maximum strain on the tape of 200 N/mm$^2$, more preferably 180 N/mm$^2$, in particular 160 N/mm$^2$, in particular 150 N/mm$^2$.

Figure 4:
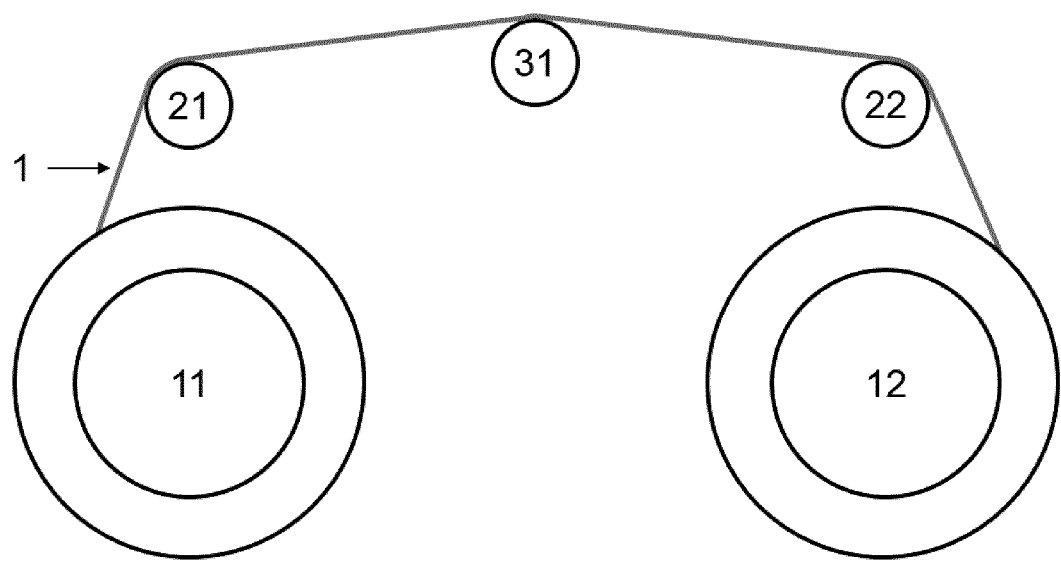
FIG. 4 shows a preferred embodiment of an aspect of the present disclosure.

FIG. 4 shows a preferred embodiment of the present invention. The depicted apparatus contains a supply spool (11) for the tape (1), a first deflector roll (21), an adjustment roll (31), a second deflector roll (22) and a receiving spool (12). The wrap angle around the adjustment spool is lower than around the deflector rolls. An apparatus with such a configuration can for example be used as a rewinding station.

Figure 5:
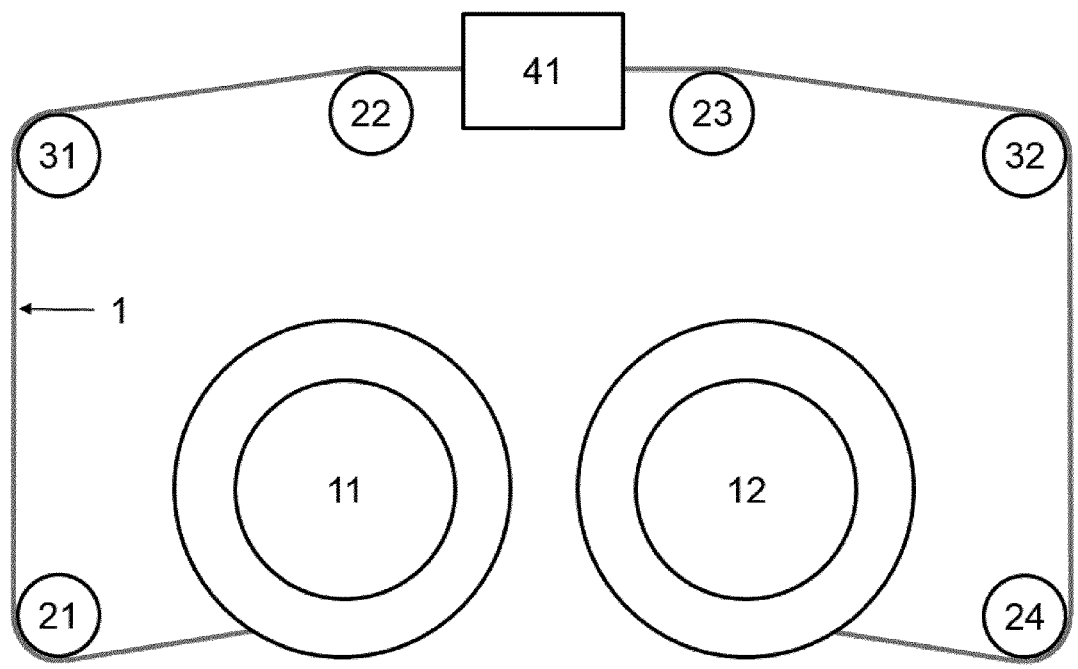
FIG. 5 shows another preferred embodiment of an aspect of the present disclosure.

FIG. 5 shows another preferred embodiment of the present invention. The depicted apparatus contains a supply spool (11) for the tape (1), a first deflector roll (21), a first adjustment roll (31), a second deflector roll (22), a processing unit (41), a third deflector roll (23), a second adjustment roll (32), a fourth deflector roll (24) and a receiving spool (12). An apparatus with such a configuration can for example be used for coating or baking the tape.

Figure 6:
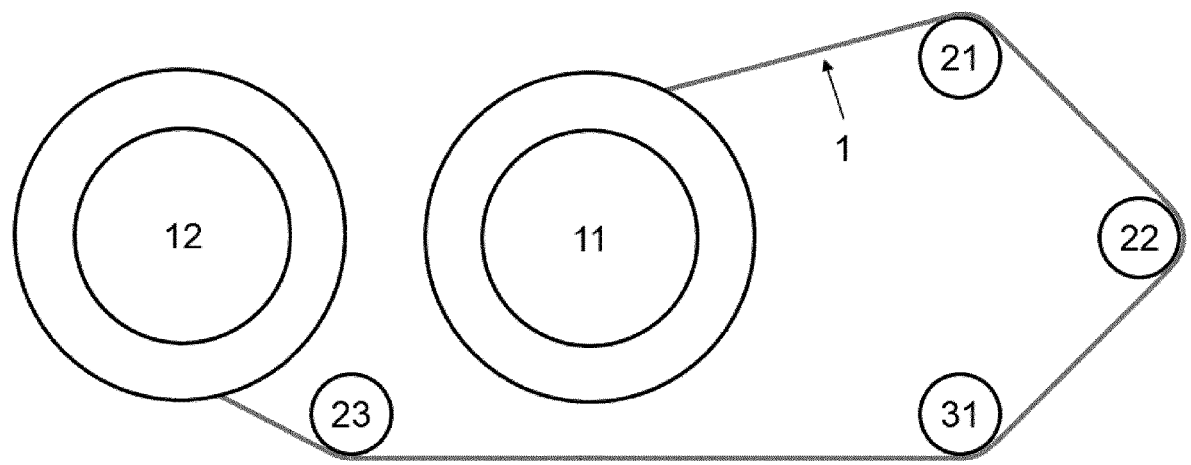
FIG. 6 shows another preferred embodiment of an aspect of the present disclosure.

FIG. 6 shows another preferred embodiment of the present invention. The depicted apparatus contains a supply spool (11) for the tape (1), a first deflector roll (21), a second deflector roll (22), a first adjustment roll (31), a third deflector roll (23), and a receiving spool (12).

The apparatus often further comprises a processing unit in which the metal tape with the ceramic coating is manipulated. Such a processing unit can be a film deposition unit including ink-deposition units such as an inkjet printing unit, a doctor-blade unit, a nozzle-coating unit; vapor-phase deposition units including a sputtering unit, an ion-beam assisted deposition unit, a chemical-vapor deposition unit, an atomic layer deposition unit; or electrochemical deposition unit. Furthermore, a processing unit can be an etch unit including wet-chemical etch units, for examples those employing strong acids, or vapor-phase etch units, for example ion-beam etching units. It is also possible that a processing unit is a means to heat the metal tape with the ceramic coating including an oven or a gas flame.

The apparatus according to the present invention is particularly well suited for superconductor tapes. Preferably, the superconductor tape comprises a metal substrate, at least one buffer layer and at least one superconductor layer. Preferably the substrate contains nickel. More preferably, the substrate contains nickel and 1 to 10 at-%, in particular 3 to 9 at-%, tungsten. The substrate is preferably textured, i.e. it has a textured surface, more preferably the texture is a cubic texture.

The buffer layer can contain any material capable of supporting the superconductor layer. Examples of buffer layer materials include metals and metal oxides, such as silver, nickel, TbO$_x$, GaO$_x$, CeO$_2$, yttria-stabilized zirconia (YSZ), Y$_2$O$_3$, LaAlO$_3$, SrTiO$_3$, Gd$_2$O$_3$, LaNiO$_3$, LaCuO$_3$, SrRuO$_3$, NdGaO$_3$, NdAlO$_3$ and/or some nitrides as known to those skilled in the art. Preferred buffer layer materials are yttrium-stabilized zirconium oxide (YSZ); various zirconates, such as gadolinium zirconate, lanthanum zirconate; titanates, such as strontium titanate; and simple oxides, such as cerium oxide, or magnesium oxide. More preferably the buffer layer contains lanthanum zirconate, cerium oxide, yttrium oxide, strontium titanate and/or rare-earth-metal-doped cerium oxide such as gadolinium-doped cerium oxide. Even more preferably the buffer layer contains lanthanum zirconate and/or cerium oxide. Preferably, the superconductor tape comprises multiple buffer layers each containing a different buffer material are between the substrate and the film. Preferably the superconductor tape includes two or three buffer layers, for example a first buffer layer comprising lanthanum zirconate and a second buffer layer containing cerium oxide. The buffer layer is preferably textured, more preferably the buffer layer has a cubic texture.

Preferably, the superconductor layer contains a compound of the formula RE$_x$Ba$_y$Cu$_3$O$_{7-\delta}$. RE stands for a rare earth metal, preferably yttrium, dysprosium, holmium, erbium, gadolinium, europium, samarium, neodymium, praseodymium, or lanthanum, in particular yttrium. The index x assumes a value of 0.9 to 1.8, preferably 1.2 to 1.5. The index y assumes a value of 1.4 to 2.2, preferably 1.5 to 1.9. The index δ assumes a value of 0.1 to 1.0, preferably 0.3 to 0.7. The superconductor layer preferably has a thickness of 200 nm to 2 μm, more preferably 400 nm to 1.5 μm. Preferably, the superconductor layer has crystal grains with a high degree of orientation to each other.

The invention claimed is:

1. A roll-to-roll apparatus, comprising:
   at least two rolls with fixed axis position; and
   at least one roll with variable axis position to adjust a tape position and/or tension,
   wherein a position and a diameter of the at least two rolls and the at least one roll are adjusted to touch a metal tape only from one side and to limit a stress on the metal tape at any point such that the metal tape is not stretched by more than 0.15%.

2. The roll-to-roll apparatus of claim 1, wherein an axis of the at least one roll with variable axis position can be moved and/or tilted.

3. The roll-to-roll of claim 1, wherein a wrap angle around the at least one roll with variable axis position is less than 90°.

4. The roll-to-roll apparatus of claim 1, wherein a diameter of the at least two rolls with fixed axis position is at least 5 cm.

5. The roll-to-roll apparatus of claim 1, wherein a diameter of the at least one roll with variable axis position is at least 5 cm.

6. The roll-to-roll apparatus of claim 1, which is adapted for processing metal tapes having a width of at least 4 cm.

7. The roll-to-roll apparatus of claim 1, wherein a distance between the at least one roll with variable axis position and a closest roll with fixed axis position is at least twice a width of the metal tape.

8. The roll-to-roll apparatus of claim 1, which comprises at least three rolls with fixed axis position.

9. The roll-to-roll apparatus of claim 1, which comprises at least two rolls with variable axis position.

10. A method of processing a metal tape, the method comprising contacting the metal tape with the apparatus of claim 1.

11. The method of claim 10, wherein the metal tape is a superconductor tape comprising a metal substrate, at least one buffer layer and at least one superconductor layer.

* * * * *